United States Patent [19]
Okazako et al.

[11] Patent Number: 5,539,303
[45] Date of Patent: Jul. 23, 1996

[54] METHOD FOR MONITORING ATMOSPHERIC PRESSURE GLOW DISCHARGE PLASMA USING CURRENT PULSE-COUNT AND/OR LISSAJOUS FIGURE

[76] Inventors: Satiko Okazako, 2-20-11, Takaido-higashi, Suginami-ku, Tokyo, 168; Masuhiro Kogoma, 843-15, Shimoniikura, Wako-shi, Saitama, 351-01, both of Japan

[21] Appl. No.: 244,928
[22] PCT Filed: Dec. 9, 1992
[86] PCT No.: PCT/JP92/01606
  § 371 Date: Sep. 1, 1994
  § 102(e) Date: Sep. 1, 1994
[87] PCT Pub. No.: WO93/12632
  PCT Pub. Date: Jun. 24, 1993

[30] Foreign Application Priority Data

Dec. 10, 1991 [JP] Japan ................................. 3-326209
Jul. 16, 1992 [JP] Japan ................................. 4-189274

[51] Int. Cl.$^6$ ................................................. G01N 27/06
[52] U.S. Cl. ........................ 324/71.1; 324/464; 324/536
[58] Field of Search ............................... 324/403, 409, 324/464, 536, 557, 713, 537, 71.1, 719; 315/111.21, 111.71; 313/231.31, 231.41

[56] References Cited

U.S. PATENT DOCUMENTS

| | | | |
|---|---|---|---|
| 3,833,851 | 9/1974 | Jobes, Jr. et al. | 324/71.1 |
| 4,207,137 | 6/1980 | Tretola | 324/719 X |
| 5,359,282 | 10/1994 | Tiu et al. | 324/464 X |

FOREIGN PATENT DOCUMENTS

| | | |
|---|---|---|
| 57-69324 | 4/1982 | Japan . |
| 2122188 | 6/1987 | Japan . |
| 63-78532 | 4/1988 | Japan . |
| 215171 | 1/1990 | Japan . |

*Primary Examiner*—Kenneth A. Wieder
*Assistant Examiner*—Diep Do
*Attorney, Agent, or Firm*—Wenderoth, Lind & Ponack

[57] ABSTRACT

Generation and stabilization of glow plasma by discharge under atmospheric pressure are monitored by detection of the number of electric current pulses per one-half cycle of an alternating voltage applied to a discharge device. Alternately, or in addition, a Lissajous figure is generated showing a correlation between the applied alternating voltage and a current flow in the discharge device, and a discharge state is discriminated according to the Lissajous figure. Accurate, quick and simple monitoring of atmospheric pressure glow discharge plasma and the control thereof are thus made possible.

16 Claims, 8 Drawing Sheets

(CURRENT)

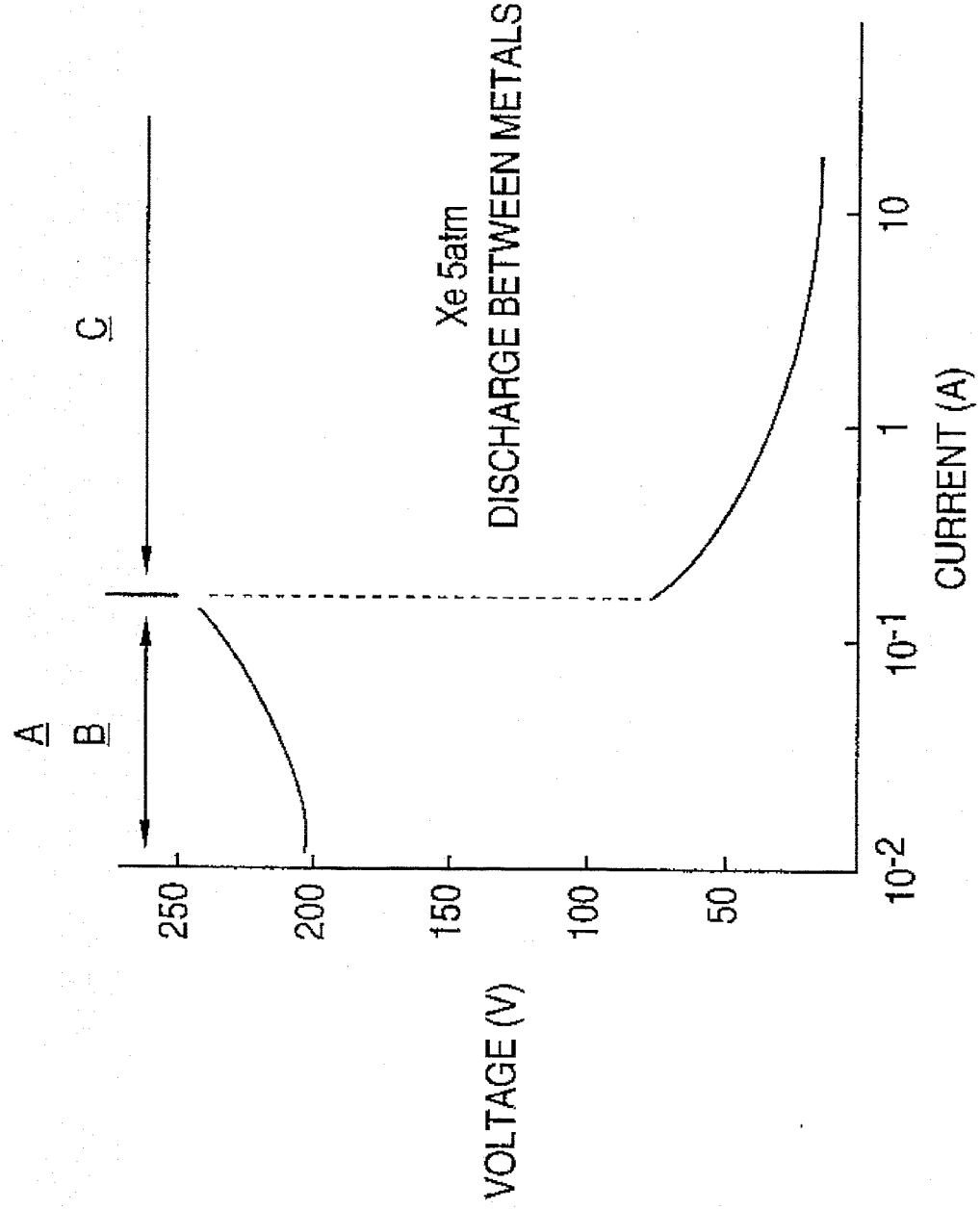

METHOD FOR MONITORING ATMOSPHERIC PRESSURE GLOW DISCHARGE PLASMA USING CURRENT PULSE-COUNT AND/OR LISSAJOUS FIGURE

TECHNICAL FIELD

The present invention relates to a method for monitoring atmospheric pressure glow discharge plasma. More particularly, the present invention relates to a novel method for monitoring atmospheric pressure glow discharge plasma in which accurate monitoring and control of the generation and stabilization of atmospheric pressure glow discharge plasma is realized during surface treatment of solids, formation of thin films, decomposition of vapor-phase waste gases, reaction of vapor-phase synthesis, or the like.

BACKGROUND TECHNOLOGY

The use of plasma, which is generated by discharge, has been studied in connection with various applications including surface treatment of semiconductors, electronics devices and other electronic materials, bio-materials, new functional polymers and other materials, formation of thin films for developing new materials, decomposition of waste gas, and reaction of vapor-phase synthesis. As a result, plasma technology has been established practical basic applications in several areas.

Plasma techniques are known which utilize glow discharge plasma generated under a so-called high vacuum condition, including plasma CVD, ion plating, plasma etching, and plasma surface treatment.

These low pressure glow discharge plasma techniques are recognized as effective in producing surfaces and thin films of a relatively good quality. However, because it is necessary to maintain a low pressure condition, these techniques suffer drawbacks in that a vacuum system must be provided and maintained, in that it is difficult to sustain discharge, and in that a huge amount of cost is necessary to keep the system air-tight.

According to conventional knowledge, generation of glow discharge plasma generally requires a low pressure condition of several Torr or below. This is because the discharge concentrates on one point a pressure of about 100 Torr, and with rising pressure the discharge shifts to sparks and arc discharge at about atmospheric pressure, making it impossible to uniformly process an object.

Now therefore the inventor of the present invention has established a glow discharge plasma technique which can be used under atmospheric pressure to replace conventional low pressure glow discharge plasma techniques, and has actively studied its applications as well. As a result, the inventor has found that the atmospheric pressure glow discharge plasma of the invention is capable of performing highly efficient and high quality surface treatment, thin film formation, etc., without using a conventional and troublesome vacuum system, and has been studying commercialization of the technique in various fields. Since then, a new development has been made for also applying the invention to so-called waste gas processing and vapor-phase synthesis reaction.

However, to further develop this atmospheric pressure glow discharge plasma technique, a plasma reaction method that is capable of generating and utilizing plasma more accurately and capable of controlling the plasma in more diverse shapes must be developed. To generate and control plasma in this way, the state of plasma must first be monitored. Such monitoring is also indispensable in the conventional low pressure method, yet in the case of the atmospheric pressure glow discharge plasma, conventionally known unvoiced discharge and arc discharge must be accurately avoided since the atmospheric pressure condition is used. For this reason, the establishment of a monitoring method for atmospheric pressure glow discharge plasma has been an important task.

DISCLOSURE OF THE INVENTION

The present invention was made in consideration of the above circumstances and provides a novel method for monitoring atmospheric pressure glow discharge plasma accurately, quickly and simply.

In particular, the present invention provides a method for monitoring atmospheric pressure glow discharge plasma wherein generation and stabilization of glow plasma by discharge under atmospheric pressure conditions are monitored by detecting a number of electric current pulses.

The present invention further provides, as embodiments, monitoring plasma based on a change in retained voltage and/or total current, in addition to the number of electric current pulses, and stably controlling plasma by detecting the state of plasma using such monitoring methods.

Further, the present invention provides for monitoring plasma using a Lissajous figure showing a correlation between voltage and electric quantity, and provides a method for generating and stabilizing atmospheric pressure glow discharge plasma more precisely by monitoring the Lissajous figure and the number of electric current pulses simultaneously.

BRIEF DESCRIPTION OF DRAWINGS

The attached drawings show the following:

FIG. 12 is a correlational diagram for the current and voltage in the glow and arc discharge.

The following symbols are used throughout the drawings:
1, 2 electrode
3, 4 dielectric
5 substrate A unvoiced discharge
B glow discharge
C arc discharge.

DETAILED DESCRIPTION OF THE PREFERRED EMBODIMENTS

As described above, the present invention enables monitoring of atmospheric pressure glow discharge plasma, such monitoring being important in the commercialization of atmospheric pressure glow discharge plasma. The invention enables constant monitoring of stability, detection and identification of the presence or absence of a shift to arc or filament discharge (unvoiced discharge) without operator attendance, and the automatic recovery of stable glow discharge.

The present invention, in order to achieve the above, is so designed as to fully detect the features of stable glow discharge, arc discharge and filament discharge, respectively, thereby detecting the shift to and/or change between these different discharge types.

Figure 1:
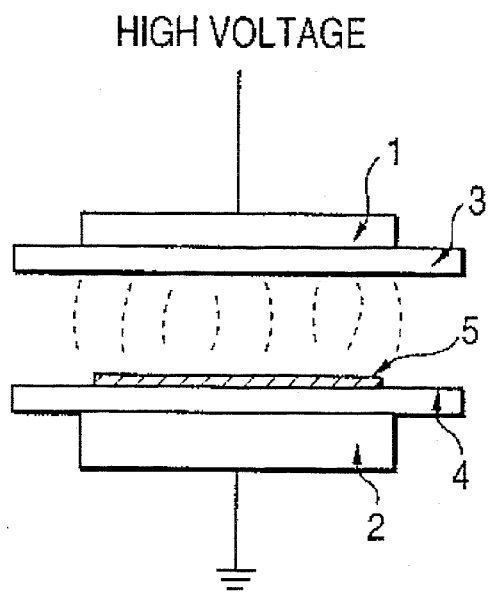
FIG. 1 is a cross-sectional view of an atmospheric pressure glow discharge plasma reactor of the present invention.

As the inventor of the present invention has already proposed, atmospheric pressure glow discharge plasma can be generated by a reaction device comprising various structures and is actually used for many purposes. For example, as shown in FIG. 1, it is possible to process the surface of a substrate (5) or form a thin film thereupon under atmospheric pressure, or trigger vapor-phase reaction such as gas decomposition without using the substrate (5), by using 90% or above rare gas or reactive gas diluted by inert gas, by opposingly arranging, for example, dielectrics (3) and (4) on both or either of upper and lower electrodes (1) and (2), respectively.

In this case, the electrode (1) may be a needle-like metallic electrode, a needle-like electrode covered by a dielectric, or a hollow cylindrical electrode.

In the case of atmospheric pressure glow discharge plasma with this type of device and under these conditions, shift to filament (unvoiced) and arc discharge must be monitored.

NUMBER OF ELECTRIC CURRENT PULSES

Figure 2:
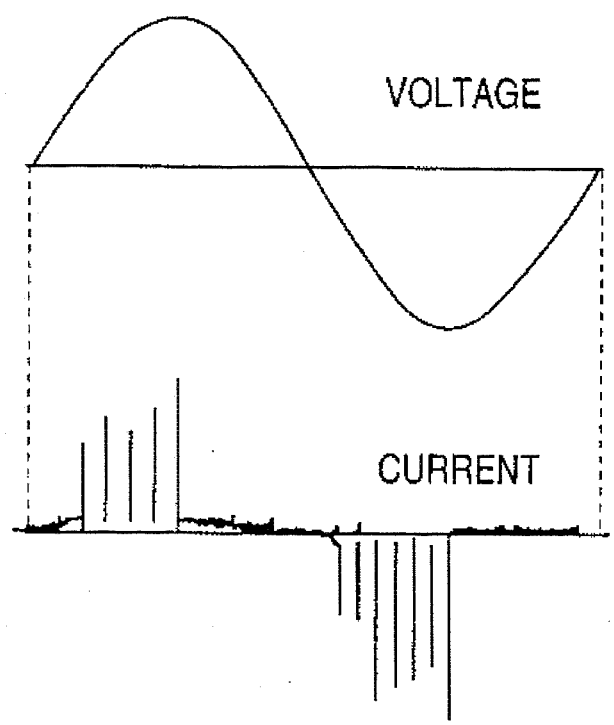
FIG. 2 is a pattern diagram showing changes in voltage and current in unvoiced discharge.
Figure 3:
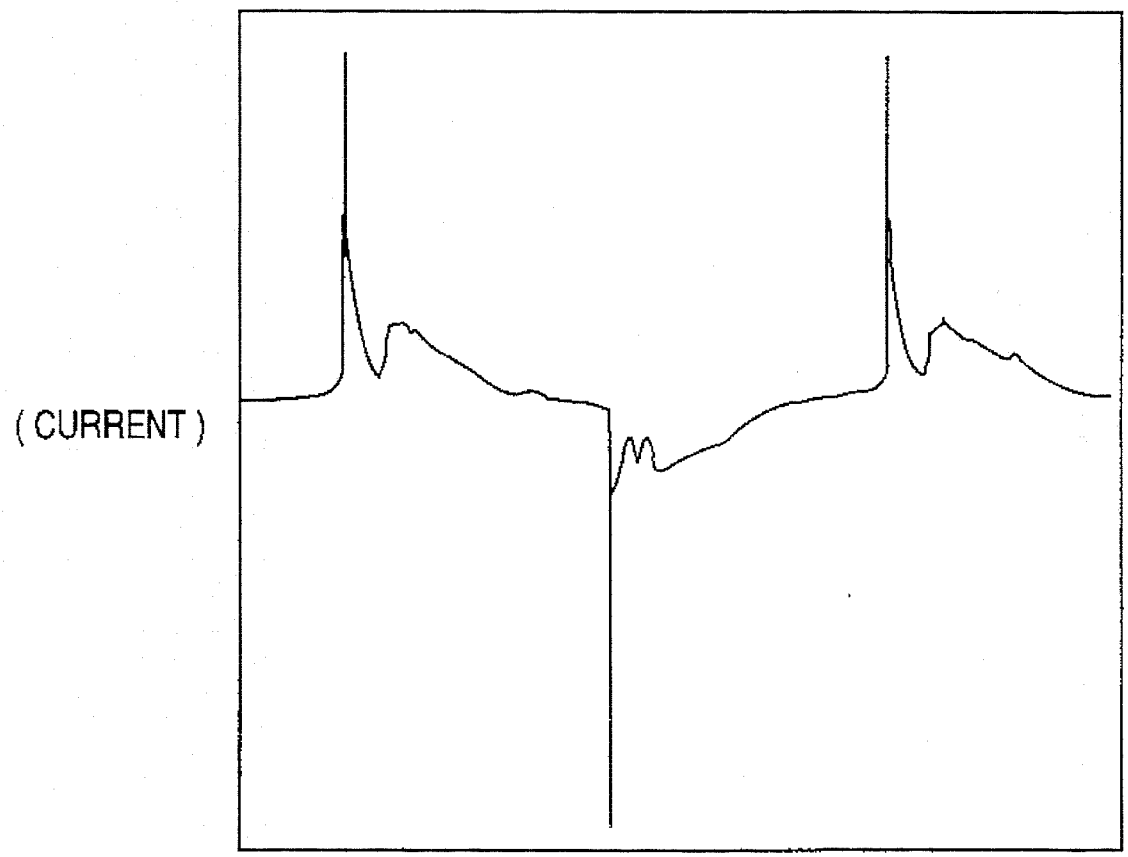
FIG. 3 is an electric current pulse diagram as observed in the atmospheric pressure glow discharge.

For this reason, the present invention detects and identifies the most probable shift, or a shift to filament (unvoiced) discharge according to the number of pulses of electric current. This is because, in the case of glow discharge plasma, the number of electric current pulses per half cycle is generally unity except when the voltage is extremely high, whereas in the case of filament (unvoiced) discharge, the number of pulses is two or more. For example, FIG. 2 shows typical current waveforms in filament discharge (50 Hz) in the oxygen atmosphere, and FIG. 3 those of He glow discharge (3 kHz).

It is thus possible to avoid filament (unvoiced) discharge and keep the atmospheric pressure glow discharge stable by clearly classifying and recognizing these typical examples.

Figure 4:
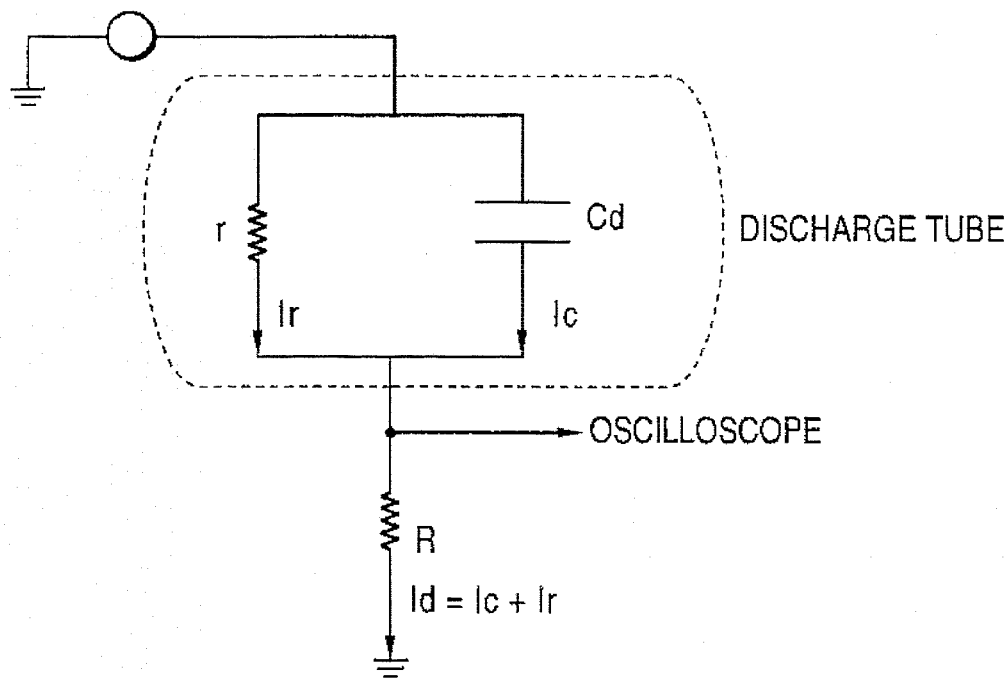
FIG. 4 is an equivalent circuit diagram.

FIG. 4 shows an example of a circuit for monitoring the number of electric current pulses. The discharge tube is shown by an equivalent circuit in the figure. The following symbols are used in the figure:
r: Discharge impedance
Cd: Equivalent capacity
R: Electric current measuring resistance.

In the figure, capacity current Ic is the capacity component of discharge current at the electric power frequency which is applied. Ir is the true discharge current. Id is the sum of both components, and thus it is necessary to separate the components in the measurement.

Now therefore, it is possible to separate the discharge current pulses for measurement from the capacity component (low frequency component) by passing the discharge current pulses through a high frequency filter. In addition, the pulse wave height (electric current) of the atmospheric pressure glow discharge is proportional to the discharge current if the number of pulses is 1/half cycle, whereas the number of pulses increases to a maximum of several (2 to 3) pulses/half-cycle as the impressed voltage increases. However, in the case of filament discharge, the number of pulses shows an unlimited number of fine discharge states, thus making it easy to identify filament discharge.

It is possible to observe with an oscilloscope the wave height of electric current pulses and the number of pulses. It is possible also to monitor the discharge current using the equation below, where H is pulse length, and n is the number of pulses/half-cycle:

$$Id = a \sum_{i=1}^{n} Hi$$

(where "a" is a constant determined by resistance R).

Ic, Ir and Id are mentioned as electric current in the above description, but it is reasonably understood that they are in fact a quantity of electricity. This is because a total quantity of electricity flowing in one second is treated as electric current. However, in the description of the present invention, the term electric current is used because a term such as "quantity of electricity of pulses" is not generally used.

RETAINED VOLTAGE/TOTAL CURRENT

A shift from a stable glow discharge or a filament discharge to an arc discharge can also be detected by the retained voltage for the purpose of discharge. For example, a shift from a stable glow to an arc discharge and from a filament discharge to an arc discharge can be detected by the change in the level of the retained voltage. This is because the voltage drops sharply when a shift to an arc discharge takes place. This is also reported by A. Bauer, P. Schulz (Z. Phys. vol. 39, p. 1302, 1971).

These shifts can also be detected by the change in total electric current. This is because the electric current increases considerably when an arc discharge takes place, and the change due to these shifts have already been observed. For this reason, more comprehensive and accurate monitoring is made possible by combining the retained voltage and electric current with the above detection and identification of the number of pulses.

LISSAJOUS FIGURE

As mentioned above, the discharge retained voltage serves as an index in the monitoring of the discharge state.

Actually, however, the measurement is not so simple, strictly speaking. This is because in the atmospheric pressure glow discharge system, as shown in FIG. 1, there are solid dielectrics between metallic electrodes and it is difficult, strictly speaking, to measure retained voltage of the discharge space and the electric current flowing through the space simply by determining electric current/voltage externally.

Now therefore, in order to use the discharge retained voltage as a more accurate index in the monitoring of the atmospheric pressure glow discharge, the present invention provides for examining a Lissajous figure which is indicative of the relation between voltage and quantity of electricity.

Figure 5:
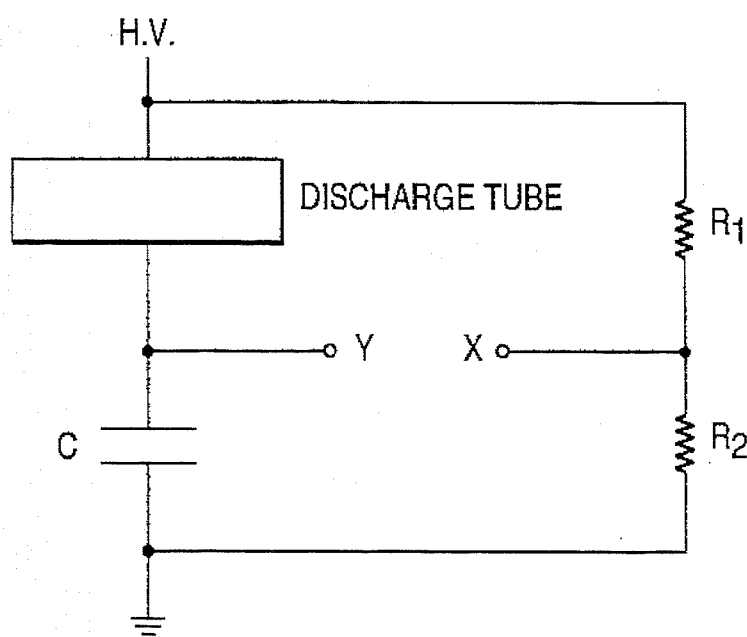
FIG. 5 is a circuit diagram for the Lissajous figure.

FIG. 5 shows an example of a measuring circuit for the purpose of Lissajous figures.

More particularly, a capacity (C) is charged with electric current flowing from a high voltage (H.V.) power supply, and the resultant voltage (Y) is depicted against the longitudinal axis on an oscilloscope. The high voltage (H.V.) is divided by a high ($R_1$) and a low ($R_2$) resistance and the voltage (X) is depicted against the horizontal axis on the oscilloscope.

In this way, a Lissajous figure comprising the correlation between the above mentioned X and Y voltages is derived as an oscillogram.

It goes without saying that the values for $R_1$, $R_2$ and C can be appropriately selected according to the size of the atmospheric pressure glow discharge and the level of impressed voltage (H.V.).

Figure 6:
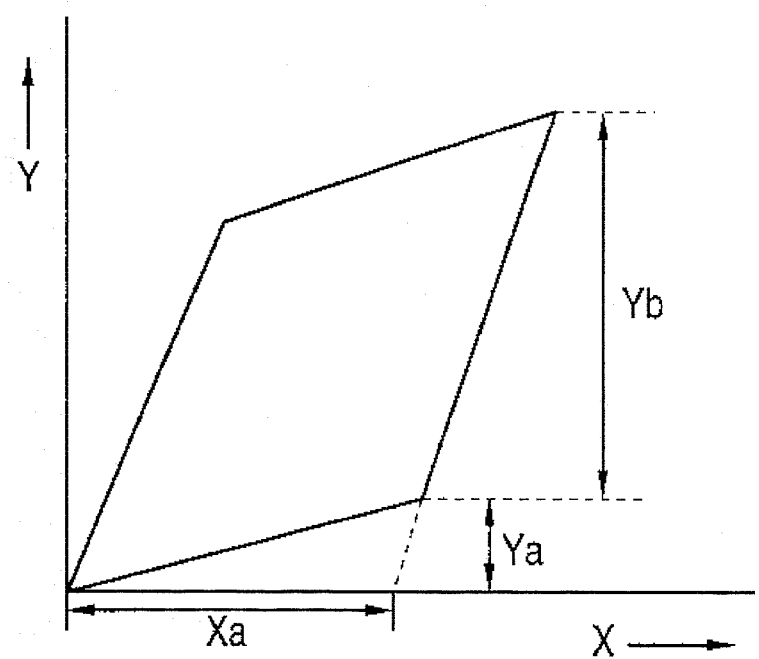
FIG. 6 is a Lissajous figure of filament discharge.
Figure 7:
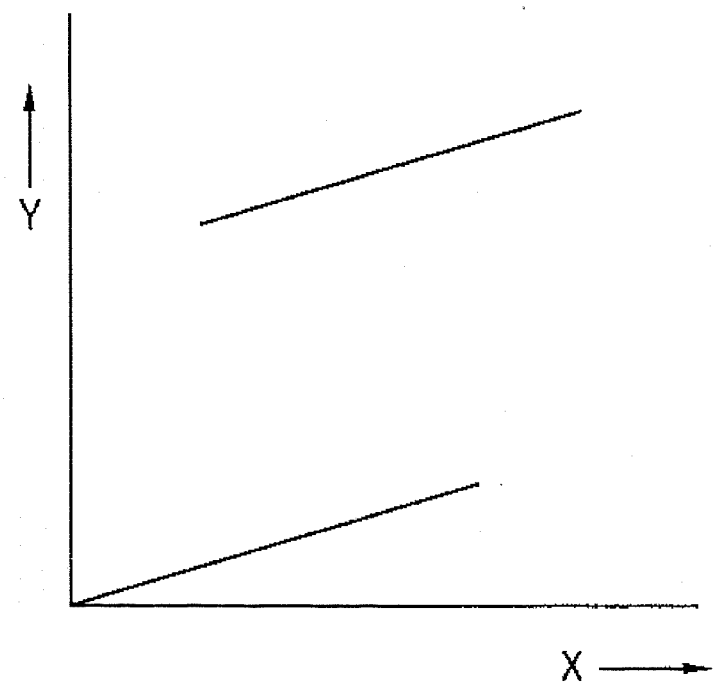
FIG. 7 is a Lissajous figure of the atmospheric pressure glow discharge.

FIG. 6 shows a typical Lissajous figure for filament discharge, and FIG. 7 shows that for glow discharge.

In these Lissajous figures, for example, capacity current equivalent (Ya), space discharge quantity of electricity/half cycle (Yb) and discharge retained voltage (Xa/2) are expressed as shown in FIG. 6.

More particularly, in these Lissajous figures, discharge retained voltage (Xa/2) is accurately determined.

Inclination of the Lissajous figure is due to the fact that the discharge tube has a capacity (solid dielectric) component.

In the case of filament (unvoiced) discharge, as is clear from the comparison of FIGS. 6 and 7, many pulses are generated for each ½ cycle and due to these multiple pulses, space discharge takes place. For this reason, a continuous or closed parallelogram is formed as shown in FIG. 6.

In the case of the atmospheric pressure glow discharge, on the other hand, there are only very few pulses, and thus a single pulse electric current is used to create the Lissajous figure, with the result being that there is a jump between two voltage lines. Although a small difference exists depending on the type of plasma gas, only two apparently parallel lines are thus observed as shown in FIG. 7. More particularly, the number (small or large) of the pulses governs the clarity of the lines of the quantity of electricity (or how clearly they appear) in the Lissajous figure. A difference between filament and glow discharge is thus quite clear.

The advantage of using a Lissajous figure is that, in addition to a clear indication of the difference between the above retained voltage and the state of discharge, it can determine the state of mixture of a filament and a glow discharge (which is difficult, as a matter of fact, to identify simply by monitoring the electric current pulses). More particularly, the pure glow discharge can also be confirmed with this Lissajous figure simultaneously with the measurement of retained voltage.

WORKING EXAMPLES (a) Discharge was conducted with a device of the same basic construction as shown in FIG. 1 in an argon (Ar) gas atmosphere (atmospheric pressure), under the following conditions:

Impression of 3 kHz high voltage

Argon (Ar) flow rate 2000 $cm^3$/min.

Filament-like pulse discharge, or so-called unvoiced discharge, occurred.

Discharge was conducted again by mixing a trace of acetone (Ac) with argon (Ar). Glow discharge occurred, which was also visually confirmed.

Figure 8:
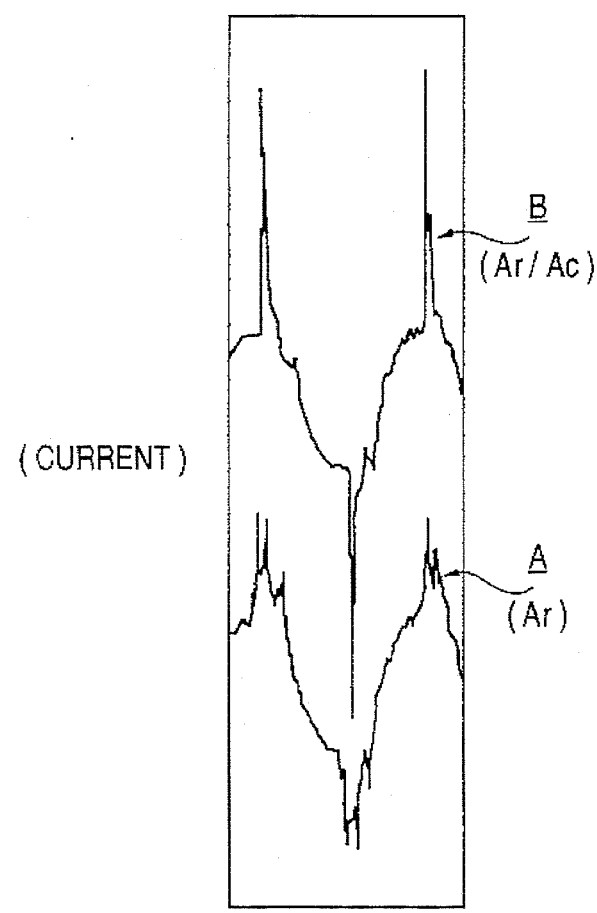
FIG. 8 is a pattern diagram showing electric current pulses in unvoiced discharge and glow discharge.

The state of electric current pulses of the above unvoiced and glow discharge was compared to find that, as shown in FIG. 8, unvoiced discharge (A) has several pulses while the stable glow discharge (B) has only one.

The unity of the electric current pulse in glow discharge is also confirmed in the glow discharge conducted in the 3 kHz helium (He) atmosphere (FIG. 3), as mentioned above.

For this reason, it was possible, for the purpose of stabilization of atmospheric pressure glow discharge plasma, to automatically detect the number of electric current pulses, and control the current, voltage and distance between electrodes by the resultant signals, thereby assuring the continuation of a stable glow discharge.

(b) The inventor of the present invention further monitored the difference between unvoiced and glow discharge in the above argon and argon plus acetone atmosphere from the viewpoint of discharge retained voltage.

Figure 9:
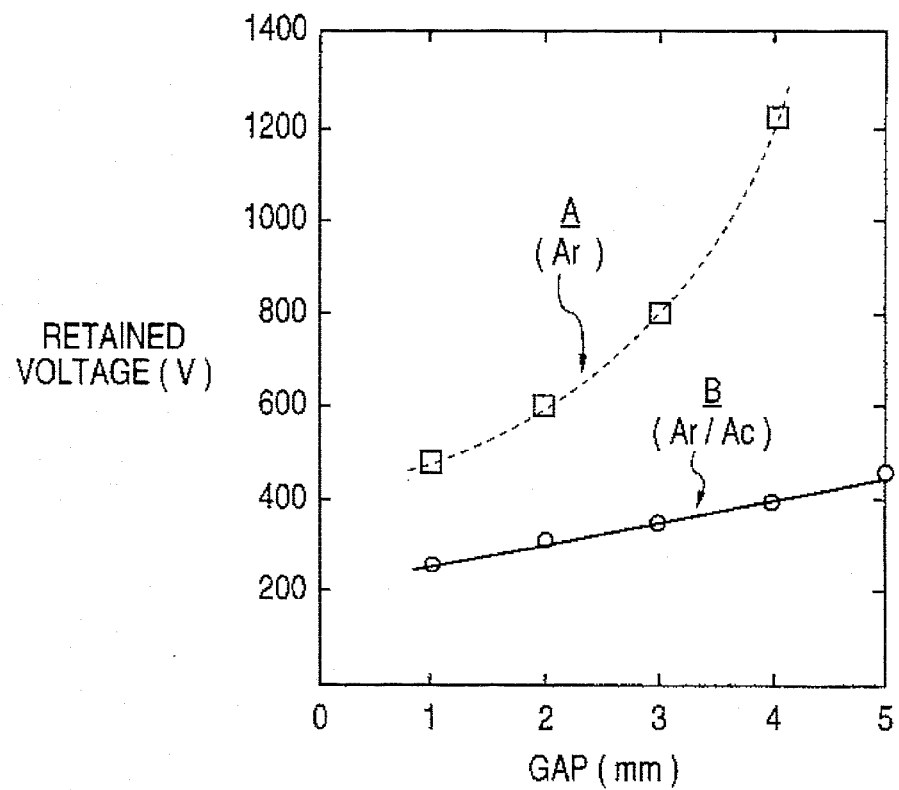
FIG. 9 is a diagram showing the change in retained voltage of unvoiced discharge and glow discharge.

FIG. 9 shows the relation between electrode gap (mm) and retained voltage (V). The figure shows the difference between glow discharge plasma (B) and filament (unvoiced) discharge (A). Both are different from an arc in that the voltage is above a few hundred volts.

As described above, a more accurate monitor with a better precision was made possible by monitoring the voltage impressed on a specified electrode gap using a specified gas and by identifying the number of electric current pulses.

Figure 11:
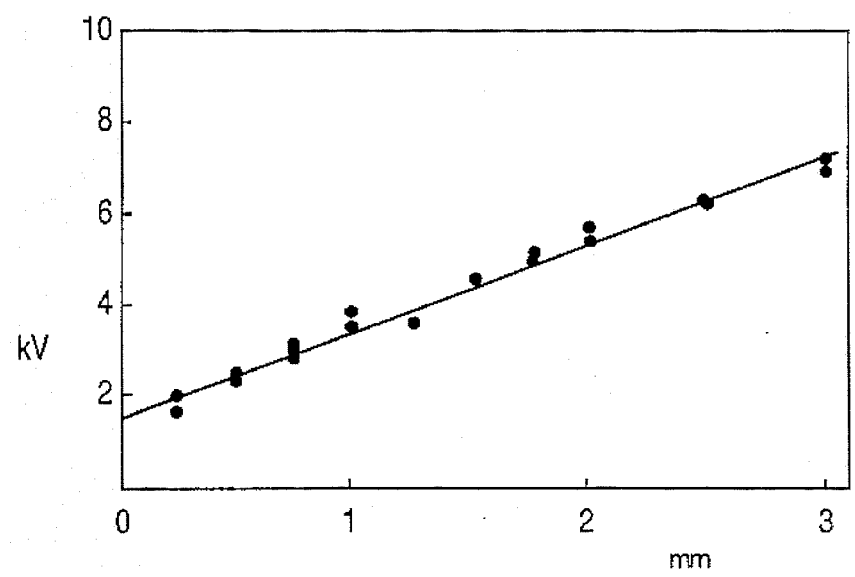
FIG. 11 is a correlational diagram showing the change in retained voltage in filament discharge.
Figure 10:
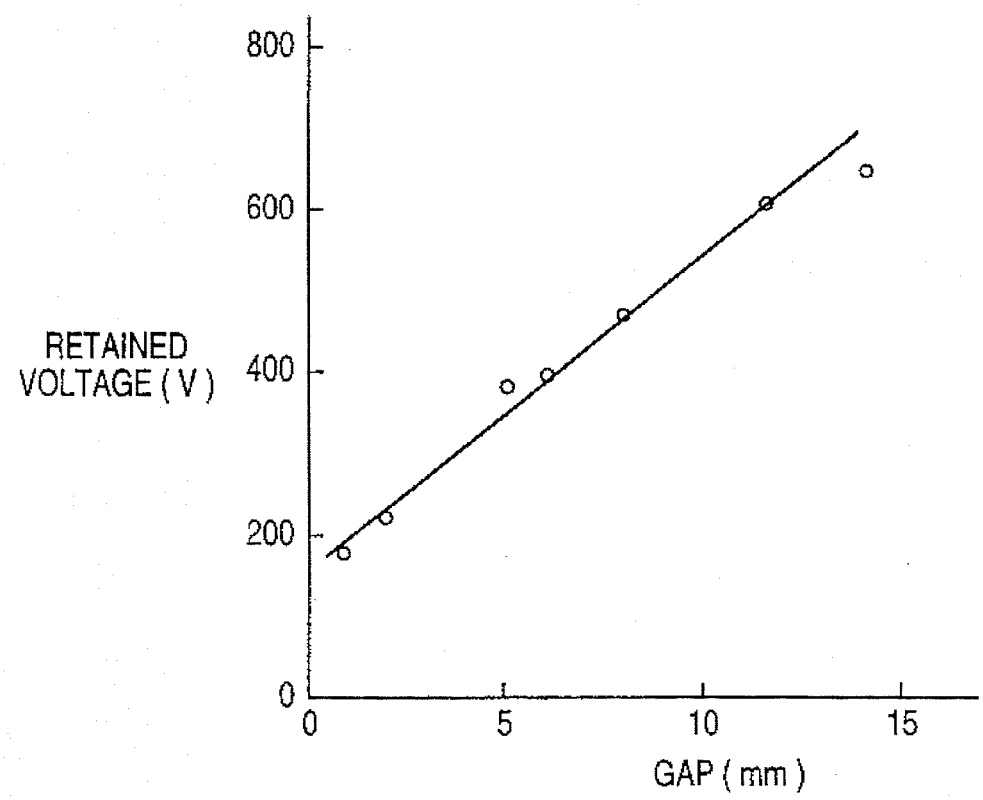
FIG. 10 is a correlational diagram showing the change in retained voltage in glow discharge.

FIG. 10 shows the relation between the gap (mm) and the retained voltage for an atmospheric pressure glow discharge plasma in a 2 kHz, He atmosphere. FIG. 11 shows the relation between the gap and the retained voltage for a filament discharge using oxygen. In both cases, a high voltage, different from an arc discharge, is shown.

Further, as described above, and as shown in FIG. 12, the difference between, on the one hand, filament (A) and glow (B) discharge and, on the other, arc discharge (C), or the features of a shift from filament (A) and glow (B) discharge to arc discharge (C), are confirmed by the correlation between current (A) and voltage (V). The voltage drops sharply with the shift to the arc discharge.

Figure 13:
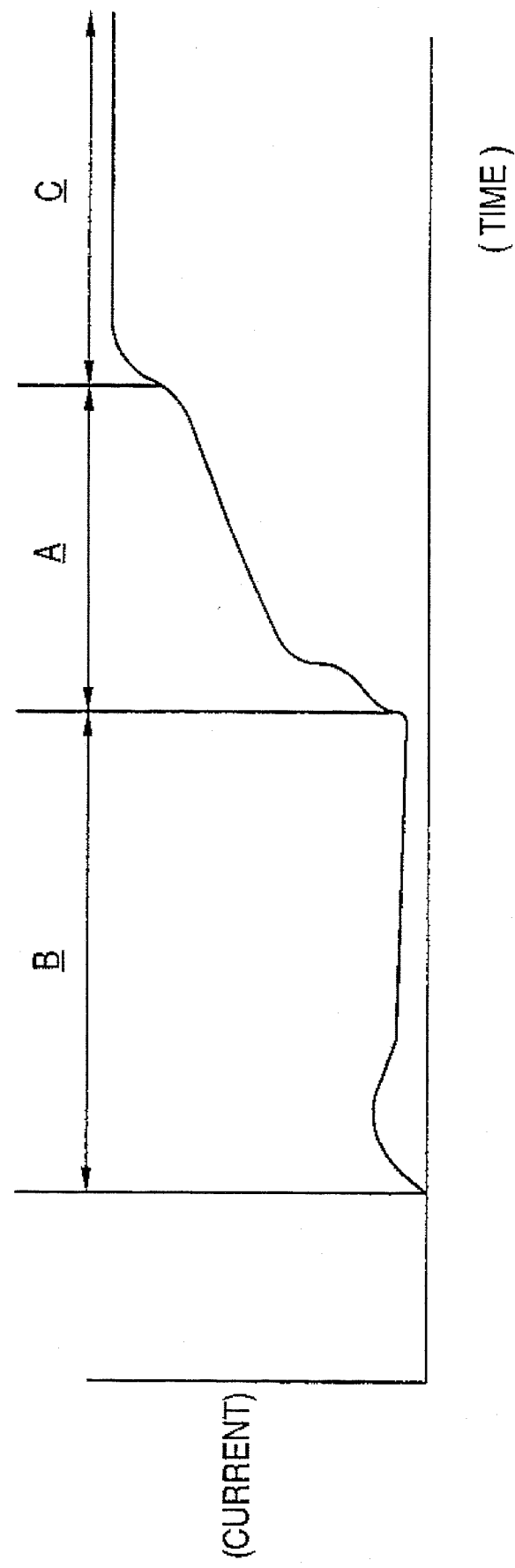
FIG. 13 shows the change in the total current over time.

(c) It is also confirmed, by observation of the total current at discharge, that the change is the same as that shown in FIG. 13 which is already reported (Kekez et al. 1970), that is, the current level increases significantly with the shift from a glow (B) to filament (A) and then to an arc (C) discharge:

(d) The pulses indicating generation of a glow discharge were observed in the measurement of the number of electric current pulses. In this measurement, a great number of fine wave heights were observed between pulses. We evaluated them by the Lissajous figure and confirmed that this state represents the mixture of FIGS. 6 and 7.

We then changed the conditions such as discharge voltage, gap between electrodes, rare gas concentration, and so on, with the result that we could confirm generation of a pure glow discharge shown in FIG. 7. A great number of fine wave heights were not observed in the electric current pulses.

(e) The above indicates that the detection of
the number of electric current pulses
retained voltage total electric current, and Lissajous figure enables accurate identification of a glow, unvoiced and arc discharge. By combining these indices, stabilization control of the atmospheric pressure glow discharge plasma has been further enhanced.

INDUSTRIAL FIELD OF UTILIZATION

As described above in detail, the present invention allows accurate, quick and simple monitoring of atmospheric pressure glow discharge plasma and the control thereof.

This monitoring method is effectively used in the surface treatment of various solids, formation of thin films on the surface of a solid, vapor-phase decomposition reaction, vapor-phase synthesis method, and the like, which use an atmospheric pressure plasma.

We claim:

1. A method for monitoring atmospheric pressure glow discharge plasma contained within a discharge device having an alternating voltage of a predetermined frequency applied thereto, comprising:

detecting a current flow in the discharge device having the alternating voltage applied thereto;

determining a number of pulses of the current flow in the discharge device per one-half cycle of the alternating voltage; and discriminating the discharge state of the discharge plasma as glow discharge when the number of pulses of the current flow per one-half cycle of the alternating voltage is at most a predetermined maximum number, and discriminating the discharge state of the discharge plasma as filament discharge when the number of pulses of the current flow per one-half cycle of the alternating voltage is more than the predetermined maximum number.

2. A method as claimed in claim 1, further comprising determining at least one of a change in a level of a retained voltage of the discharge device and a change in a total electric current of the discharge device, and further discriminating the discharge state of the discharge plasma according to the at least one of the change in the level of the retained voltage and the change in the total electric current.

3. A method as claimed in claim 1, wherein said predetermined maximum number is between 1 and 3 inclusive.

4. A method as claimed in claim 2, wherein said predetermined maximum number is between 1 and 3 inclusive.

5. A method as claimed in claim 1, wherein said detecting step includes applying an output of the discharge device to an oscilloscope to display a waveform showing the current flow in the discharge device.

6. A method as claimed in claim 2, wherein said detecting step includes applying an output of the discharge device to an oscilloscope to display a waveform showing the current flow in the discharge device.

7. A method as claimed in claim 3, wherein said detecting step includes applying an output of the discharge device to an oscilloscope to display a waveform showing the current flow in the discharge device.

8. A method as claimed in claim 4, wherein said detecting step includes applying an output of the discharge device to an oscilloscope to display a waveform showing the current flow in the discharge device.

9. A method for monitoring atmospheric pressure glow discharge plasma contained within a discharge device having an alternating voltage of a predetermined frequency applied thereto, comprising:

detecting a current flow in the discharge device having the alternating voltage applied thereto;

generating a Lissajous figure showing a correlation between the current flow in the discharge device and the alternating voltage; and discriminating a discharge state of the discharge plasma according to the Lissajous figure.

10. A method as claimed in claim 9, further comprising determining a number of pulses of the current flow per one half cycle of the alternating voltage, and further discriminating the discharge state of the discharge plasma according to the number of pulses per one-half cycle of the alternating voltage.

11. A method as claimed in claim 9, wherein said discriminating a discharge state includes discriminating the discharge state of the discharge plasma as glow discharge when the Lissajous figure consists of two parallel lines, and discriminating the discharge state of the discharge plasma as filament discharge when the Lissajous figure is a closed parallelogram.

12. A method as claimed in claim 10, wherein said discriminating a discharge state includes discriminating the discharge state of the discharge plasma as glow discharge when the Lissajous figure consists of two parallel lines, and discriminating the discharge state of the discharge plasma as filament discharge when the Lissajous figure is a closed parallelogram.

13. A method as claimed in claim 9, wherein said generating step includes using an oscilloscope to display the Lissajous figure.

14. A method as claimed in claim 10, wherein said generating step includes using an oscilloscope to display the Lissajous figure.

15. A method as claimed in claim 11, wherein said generating step includes using an oscilloscope to display the Lissajous figure.

16. A method as claimed in claim 12, wherein said generating step includes using an oscilloscope to display the Lissajous figure.

* * * * *